(12) United States Patent
Sato et al.

(10) Patent No.: US 9,966,234 B2
(45) Date of Patent: May 8, 2018

(54) FILM FORMING DEVICE

(71) Applicant: Toyota Jidosha Kabushiki Kaisha, Toyota-shi (JP)

(72) Inventors: Takayasu Sato, Takahama (JP); Yoji Sato, Kasugai (JP); Kazutaka Tachibana, Nagoya (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 176 days.

(21) Appl. No.: 14/793,041

(22) Filed: Jul. 7, 2015

(65) Prior Publication Data
US 2016/0013027 A1    Jan. 14, 2016

(30) Foreign Application Priority Data

Jul. 11, 2014    (JP) .................. 2014-143532

(51) Int. Cl.
| C23C 14/00 | (2006.01) |
| H01J 37/32 | (2006.01) |
| C23C 14/32 | (2006.01) |
| H01J 37/34 | (2006.01) |

(52) U.S. Cl.
CPC ...... *H01J 37/32559* (2013.01); *C23C 14/325* (2013.01); *H01J 37/32055* (2013.01); *H01J 37/34* (2013.01)

(58) Field of Classification Search
CPC .................................................. C23C 14/325
See application file for complete search history.

(56) References Cited

U.S. PATENT DOCUMENTS

| 6,187,160 B1* | 2/2001 | Rick ................... H01J 37/3405 |
| | | 204/298.2 |
| 6,916,399 B1* | 7/2005 | Rozenzon ............ H01J 37/321 |
| | | 118/715 |
| 2002/0047540 A1 | 4/2002 | Fujita et al. |
| 2004/0038033 A1 | 2/2004 | Massler et al. |
| 2008/0006523 A1* | 1/2008 | Hosokawa ........... C23C 14/042 |
| | | 204/192.1 |
| 2011/0067631 A1 | 3/2011 | Tamagaki et al. |

(Continued)

FOREIGN PATENT DOCUMENTS

| DE | 100 18 143 A1 | 10/2001 |
| JP | 2001-355064 | 12/2001 |

(Continued)

*Primary Examiner* — Timon Wanga
(74) *Attorney, Agent, or Firm* — Oblon, McClelland, Maier & Neustadt, L.L.P.

(57) ABSTRACT

A film forming device includes a cylindrical evaporation source, closing members, and an auxiliary electrode. The cylindrical evaporation source is configured to accommodate a workpiece in an internal space of the cylindrical evaporation source. The cylindrical evaporation source is configured to discharge ions from the cylindrical evaporation source by arc discharge such that the ions are deposited on a surface of the workpiece. The closing members close the internal space. The auxiliary electrode is disposed along an inner wall surface of the cylindrical evaporation source. The auxiliary electrode is configured to be grounded or to be applied with a positive voltage such that electrons of the internal space flow to the auxiliary electrode.

6 Claims, 6 Drawing Sheets

(56) References Cited

U.S. PATENT DOCUMENTS

2012/0080309 A1* 4/2012 Bender .................. H01J 37/34
                                                  204/192.12
2013/0142991 A1* 6/2013 Cao ..................... C23C 14/0015
                                                  428/138
2014/0042022 A1* 2/2014 Xu ....................... C23C 14/566
                                                  204/298.15

FOREIGN PATENT DOCUMENTS

| JP | 2007-138286 | 6/2007 |
| JP | 2013-36106  | 2/2013 |
| JP | 2015-40313  | 3/2015 |

* cited by examiner

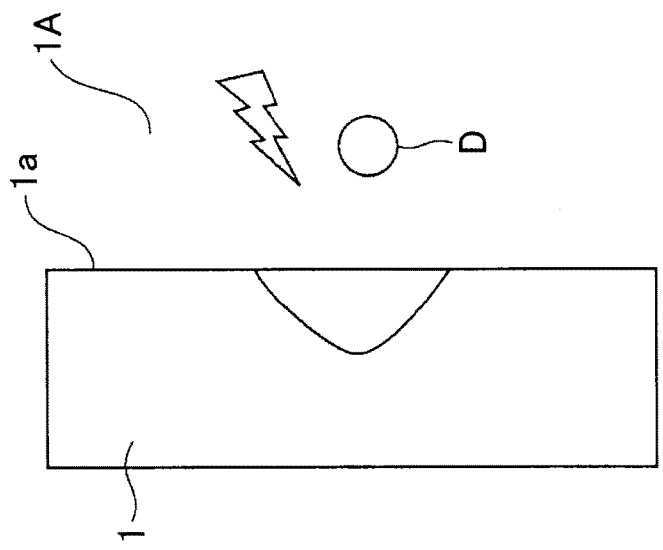
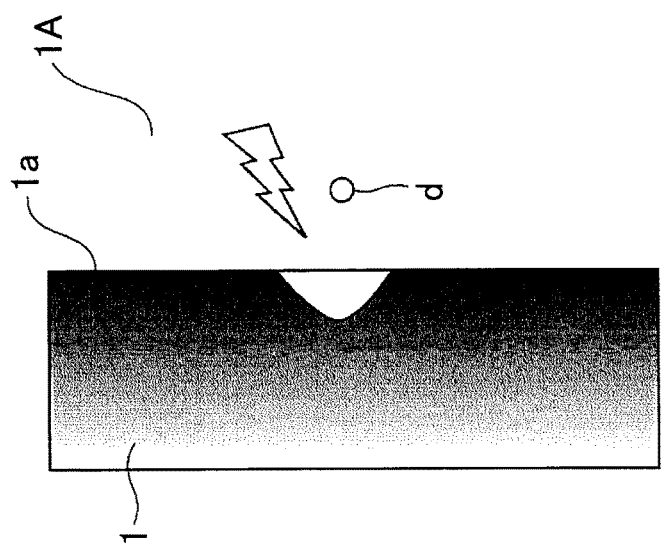

FILM FORMING DEVICE

INCORPORATION BY REFERENCE

The disclosure of Japanese Patent Application No. 2014-143532 filed on Jul. 11, 2014 including the specification, drawings and abstract is incorporated herein by reference in its entirety.

BACKGROUND OF THE INVENTION

1. Field of the Invention

The present invention relates to a film forming device which is used for, for example, an arc ion plating method.

2. Description of Related Art

An arc ion plating (hereinafter, abbreviated as "AIP") method is an ion plating method in which a solid material is evaporated using vacuum arc discharge. In this method, the ionization rate of the evaporated material is high, and a film having superior adhesion can be formed.

In the AIP method, vacuum arc discharge is caused to occur between a target (evaporation source), which is a cathode, and an anode in a vacuum so as to evaporate and ionize a material on a target surface, and ions are deposited on a workpiece surface to which a negative bias voltage is applied, thereby forming a film.

In a film forming device of the related art which is used to form a film using the AIP method, as shown in FIG. 6, a cylindrical evaporation source 901 and closing surfaces of closing members 902 form a container, in which the closing members allow the inside of the evaporation source 901 to be a closed space. In this container in a vacuum, the evaporation source is caused to discharge ions to form a film on a surface of a workpiece W which is disposed in the container (for example, refer to Japanese Patent Application Publication No. 2013-36106 (JP 2013-36106 A).

SUMMARY OF THE INVENTION

In the film forming device disclosed in JP 2013-36106 A, when a thin film is formed on the surface of the workpiece by causing the evaporation source to discharge ions in the container in a vacuum, the film formation efficiency can be improved with a simple configuration. In this film forming device, the evaporation source as the cathode is formed in a cylindrical shape, and openings thereof are closed with the closing members. For example, the closing members are grounded and function as the anode. Therefore, electrons generated in the container flow to the closing members to generate a current. Therefore, the closing members may be Joule-heated to a high temperature. In this case, for example, a seal material between the closing members and the evaporation source may deteriorate due to the heat.

The invention provides a film forming device capable of suppressing Joule heat generated in closing members that close an internal space of a cylindrical evaporation source.

According to an aspect of the invention, a film forming device includes an cylindrical evaporation source, closing members, and an auxiliary electrode. The cylindrical evaporation source is configured to accommodate a workpiece in an internal space of the evaporation source. The cylindrical evaporation source is configured to discharge ions from the evaporation source by arc discharge such that the ions are deposited on a surface of the workpiece. The closing members close the internal space. The auxiliary electrode is disposed along an inner wall surface of the cylindrical evaporation source. The auxiliary electrode is configured to be grounded or to be applied with a positive voltage such that electrons of the internal space flow to the auxiliary electrode.

In the film forming device according to the aspect, the internal space of the cylindrical evaporation source is a closed space which is closed by the closing members, in which ions generated from the inner wall surface of the cylindrical evaporation source are discharged by arc discharge. The internal space of the cylindrical evaporation source may be caused to be in a high-vacuum state using, for example, an appropriate vacuum device. A material of the cylindrical evaporation source is selected according to a material of a film to be formed on a workpiece without any particular limitation. For example, Ti (titanium), Cr (chromium), or W (tungsten) may be used. Using appropriate gas supply means, for example, process gas such as $N_2$ (nitrogen), Ar (argon), or hydrocarbon may be supplied to the internal space of the cylindrical evaporation source in a high-vacuum state.

The closing members are grounded by applying a discharge voltage from an external power supply to the cylindrical evaporation source and applying a bias voltage from a bias supply to the workpiece accommodated in the internal space of the cylindrical evaporation source. As a result, arc discharge is caused to occur between the cylindrical evaporation source as a cathode and the closing members as an anode such that a high-density current is concentrated on an arc spot of the inner wall surface of the cylindrical evaporation source, and ions are discharged. At this time, secondarily, electrons are emitted to the internal space of the cylindrical evaporation source. When the ions are deposited on the surface of the workpiece in the internal space of the cylindrical evaporation source to form a film thereon, the electrons emitted to the internal space flow to the closing members.

For example, in the film forming device of the related art disclosed in JP 2013-36106 A, as shown in FIG. 6, the grounded anode is formed of only the closing members 902 that close the evaporation source 901. Therefore, the area of the anode is insufficient, and a long period of discharge may be unstable. In addition, the electrons e of the internal space of the evaporation source 901 intensively flow to the closing members 902 to generate a current such that the closing members 902 are Joule-heated. As a result, the closing members 902 are heated to a high temperature due to a long period of discharge, and a seal member, such as an O-ring or a gasket (Teflon sheet), which maintains a vacuum between the closing members 902 and the evaporation source 901 may be damaged by heat.

On the other hand, in the film forming device according to the invention, the auxiliary electrode that allows the electrons to flow from the internal space of the cylindrical evaporation source is disposed along the inner wall surface of the cylindrical evaporation source. That is, for example, the auxiliary electrode is grounded or is applied with a positive voltage, which is lower than a voltage of the cylindrical evaporation source, so as to function as the anode as in the case of the closing members. In addition, if the auxiliary electrode is not provided, the closing members receive a portion of the flowing electrons. As a result, the amount of electrons flowing to the closing members decreases, the amount of a current generated in the closing members decreases, and the amount of Joule heat generated in the closing members can be suppressed.

In the film forming device according to the aspect, the cylindrical evaporation source may be a cathode. The closing members and the auxiliary electrode may be anodes having an internal cooling structure. As a result, the area of the anode is increased to be larger than that of the related art due to the auxiliary electrode, and arc discharge in the internal space of the cylindrical evaporation source can be made to be stable.

The auxiliary electrode may include a gas passage which supplies process gas to the internal space of the cylindrical evaporation source. As a result, the gas passage is disposed along the inner wall surface of the cylindrical evaporation source such that electrons are likely to flow thereto, and the auxiliary electrode and peripheral members thereof which are likely to be heated to a relatively high temperature are actively cooled by the process gas, which can suppress a temperature increase. That is, the gas passage for the supply of the process gas functions as the internal cooling structure of the closing members and the auxiliary electrode. Accordingly, the thermal deformation of the auxiliary electrode and the peripheral members thereof can be efficiently suppressed. In addition, the damage of a seal member and the like which maintain a vacuum near the auxiliary electrode can be prevented. For example, the heat resistance temperature of a seal member such as an O-ring or a gasket can be decreased.

In addition, the auxiliary electrode may have a gas discharge hole of the gas passage near an arc spot of the cylindrical evaporation source such that the process gas may be supplied to a region near the arc spot of the evaporation source. As a result, in the internal space of the cylindrical evaporation source in a high-vacuum state, plasma can be efficiently generated in the region near the arc spot to make arc discharge stable.

Here, for example, when Ti or a Ti alloy is used as the material of the evaporation source, process gas containing $C_2H_2$ (acetylene) may be used. As a result, TiC (titanium carbide) having a higher melting point than that of Ti is likely to be produced on the inner wall surface of the cylindrical evaporation source. Due to arc discharge, not only ions of a metal material of the cylindrical evaporation source but also droplets which are molten metal particles are discharged to the internal space of the cylindrical evaporation source. When these droplets are incorporated into the film on the surface of the workpiece, the surface roughness of the film may deteriorate. However, when TiC having a higher melting point than that of Ti is produced on the inner wall surface of the cylindrical evaporation source, the particle size of droplets produced from TiC can be made to be less than that of droplets produced from Ti. Accordingly, the surface roughness of the film on the workpiece can be decreased.

A shield member may be disposed between the cylindrical evaporation source and the auxiliary electrode so as to prevent discharge therebetween. When the auxiliary electrode as the anode is disposed along the inner wall surface of the cylindrical evaporation source as the cathode, the anode and the cathode are close enough to each other to cause direct discharge. As a result, ions of a metal material constituting the cylindrical evaporation source may be inefficiently deposited on the surface of the workpiece. Therefore, by the shield member preventing discharge between the cylindrical evaporation source and the auxiliary electrode, ions of a metal material constituting the cylindrical evaporation source can be efficiently deposited on the surface of the workpiece.

Here, the shield member may be insulated from the cylindrical evaporation source and the auxiliary electrode. For example, the shield member may be fixed to the auxiliary electrode, the cylindrical evaporation source, or the closing members through an insulating member having electrical insulating properties. Here, the shield member is not grounded. As a result, the shield member is electrically insulated from the cylindrical evaporation source and the auxiliary electrode such that the potential can be made to be the same as that of plasma of the internal space of the cylindrical evaporation source, and discharge between the cylindrical evaporation source and the auxiliary electrode can be efficiently prevented.

In the film forming device according to the aspect, the auxiliary electrode functions as the anode as in the case of the closing members. In addition, if the auxiliary electrode is not provided, the closing members receive a portion of the flowing electrons. As a result, as compared to a film forming device of the related art, the amount of electrons flowing to the closing members decreases, the amount of a current generated in the closing members decreases, and the amount of Joule heat generated in the closing members can be suppressed.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 3A is a schematic diagram showing droplets produced from TiC;

FIG. 3B is a schematic diagram showing droplets produced from Ti;

DETAILED DESCRIPTION OF EMBODIMENTS

Hereinafter, a film forming device according to the invention will be described based on an embodiment with reference to the drawings.

Figure 1:
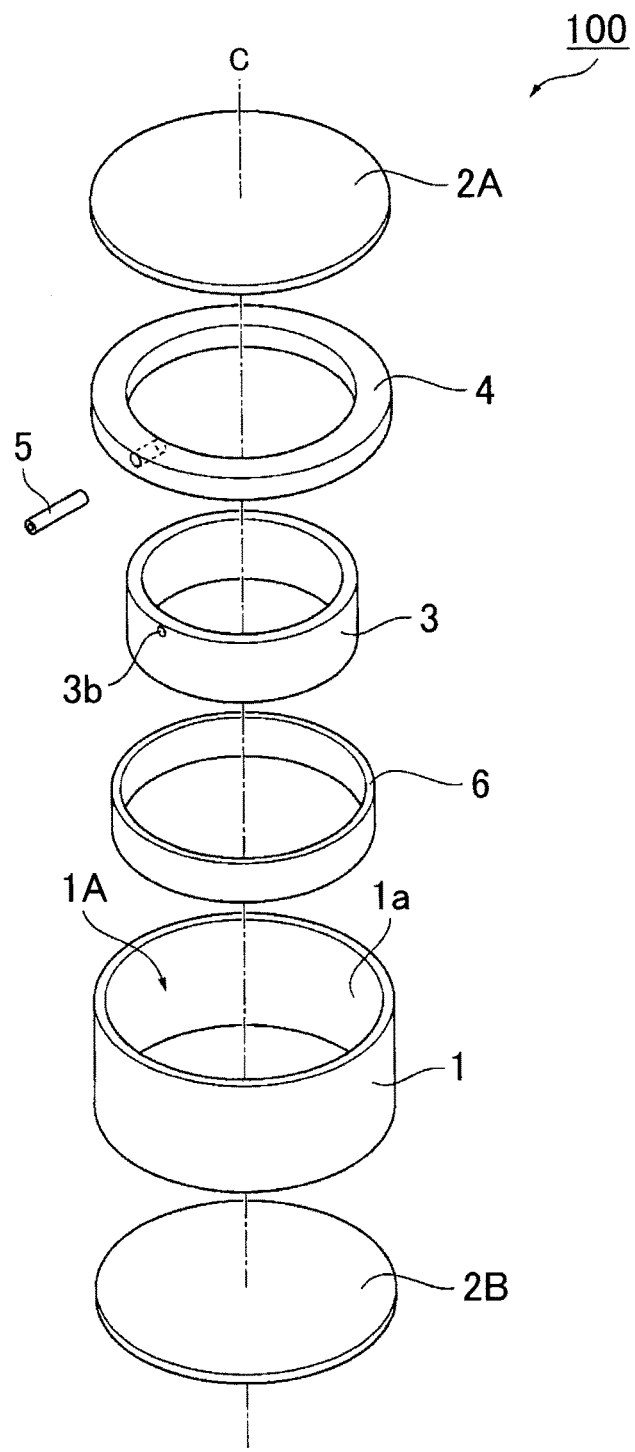
FIG. 1 is an exploded perspective view schematically showing an embodiment of a film forming device according to the invention.
Figure 2:
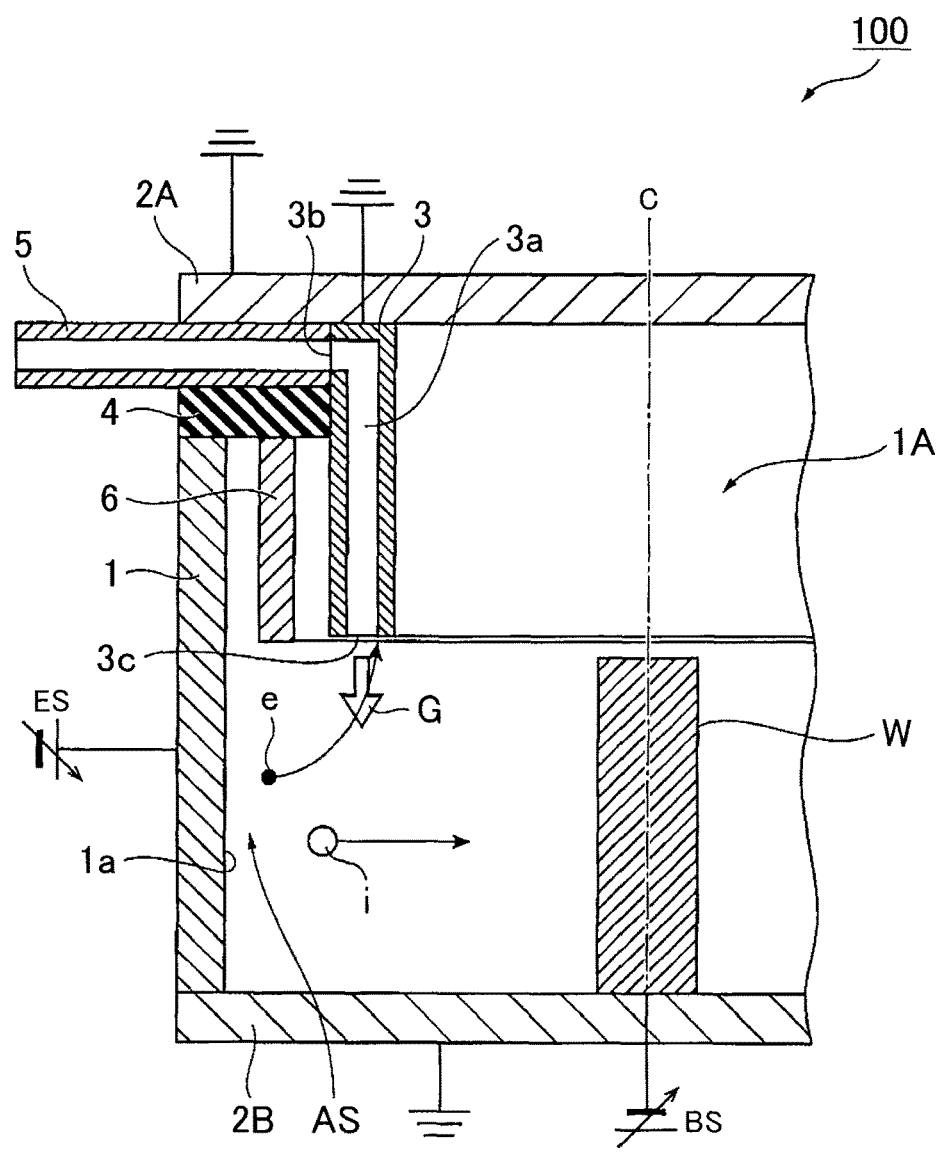
FIG. 2 is an enlarged cross-sectional view showing a part of the film forming device shown in FIG. 1.

FIG. 1 is an exploded perspective view schematically showing an embodiment of a film forming device 100 according to the invention. FIG. 2 is an enlarged cross-sectional view showing a part of the film forming device 100 shown in FIG. 1.

The film forming device 100 according to the invention includes: a cylindrical evaporation source 1 that has an internal space 1A for accommodating a workpiece W; and closing members 2A, 2B that close the internal space 1A, in which ions i which are discharged from the evaporation source 1 by arc discharge are deposited on a surface of the workpiece W to form a film thereon. The film forming device 100 according to the invention is mostly characterized in that an auxiliary electrode 3 is disposed along the inner wall surface 1*a* of the evaporation source 1, in which the auxiliary electrode 3 is grounded or is applied with a positive voltage such that electrons e of the internal space 1A of the evaporation source 1 can flow to the auxiliary electrode 3. Hereinafter, the embodiment of the film forming device 100 according to the invention will be described.

For example, the evaporation source 1 is formed in a cylindrical shape and has the internal space 1A therein. A material of the evaporation source 1 is selected according to a material of a film to be formed on the surface of the workpiece W. For example, a metal material such as Ti (titanium), Cr (chromium), or W (tungsten) may be used. In the film forming device 100 according to the embodiment, Ti is used as the material of the evaporation source 1. The evaporation source 1 is connected to an external power supply ES. Therefore, a discharge current is supplied to the evaporation source 1, and ions i of a metal material are discharged to the internal space 1A by arc discharge. The evaporation source 1 has an opening at both ends in a height direction, that is, at both ends in a direction moving along a central axis C. The evaporation source 1 is not limited to a cylindrical shape. For example, the evaporation source 1 can be formed in a cylindrical shape having an arbitrary cross-sectional shape such as an elliptical shape, a rectangular shape, or a polygonal shape, or can be formed in a bottomed cylindrical shape having an opening at only one end.

The closing members 2A, 2B are plate-shaped members which seal openings of the cylindrical evaporation source 1 so as to close the internal space 1A of the evaporation source 1. The closing members 2A, 2B are formed of, for example, a conductive metal material. The film forming device 100 according to the embodiment includes a pair of closing members 2A, 2B which close upper and lower openings of the evaporation source 1. An insulating seal member 4 having insulating properties and sealing properties is disposed between the upper closing member 2A and the evaporation source 1, and the same insulating seal member (not shown) is disposed between the lower closing member 2B and the evaporation source 1. As a result, the upper and lower closing members 2A, 2B and the evaporation source 1 are insulated from each other and are sealed.

The upper and lower closing members 2A, 2B are grounded, respectively. When the evaporation source 1 is formed in a bottomed cylindrical shape, the film forming device 100 includes only either the closing member 2A or the closing member 2B which is grounded and seals an opening of one end of the evaporation source 1. The internal space 1A of the evaporation source 1, which is closed by the closing members 2A, 2B and the insulating seal members 4 to be a closed space, is caused to be in a high-vacuum state using, for example, an appropriate vacuum device (not shown). Although not shown in the drawings, an electromagnetic coil is disposed radially outside the upper and lower closing members 2A, 2B or is disposed above the upper closing member 2A or below the lower closing member 2B. As a result, a magnetic field which applies an electromagnetic force to the ions i in a direction toward the radial center of the evaporation source 1 is generated, in which the ions i are discharged to the internal space 1A of the evaporation source 1.

The auxiliary electrode 3 is accommodated in the internal space 1A of the evaporation source 1 which is closed by the closing members 2A, 2B. The auxiliary electrode 3 is formed of, for example, a conductive metal material or an alloy thereof such as Au (gold), Ag (silver), Cu (copper), or Al (aluminum). For example, the auxiliary electrode 3 is grounded or is connected to an external power supply to be applied with a predetermined positive voltage. As a result, the electrons e present in the internal space 1A of the evaporation source 1 flow to the auxiliary electrode 3. For example, the auxiliary electrode 3 can be fixed to a lower surface of the upper closing member 2A using an appropriate method.

For example, the auxiliary electrode 3 is formed in a cylindrical shape having a central axis C, which is parallel to the central axis C of the evaporation source 1, and is accommodated in the internal space 1A of the evaporation source 1. As a result, the auxiliary electrode 3 is disposed along the inner wall surface 1*a* of the evaporation source 1. In the embodiment, the auxiliary electrode 3 is cylindrical as in the case of the evaporation source 1 and has a central axis C common to the evaporation source 1. The auxiliary electrode 3 is disposed to be near the inner wall surface 1*a* of the evaporation source 1. For example, the outer diameter of the auxiliary electrode 3 disposed inside the evaporation source 1 is controlled to be ½ or more than the inner diameter of the evaporation source 1. As a result, the auxiliary electrode 3 can be disposed to be near the inner wall surface 1*a* of the evaporation source 1.

The auxiliary electrode 3 according to the embodiment includes a gas passage 3*a* which supplies process gas G to the internal space 1A of the evaporation source 1. The gas passage 3*a* has a gas introduction hole 3*b* at an upper end of a side surface of the auxiliary electrode 3 and has a gas discharge hole 3*c* at a lower end of the auxiliary electrode 3. A pipe 5 for the supply of the process gas G from appropriate gas supply means (not show) is connected to the gas introduction hole 3*b*. As a result, the gas passage 3*a* is configured to supply arbitrary process gas G to the internal space 1A. For example, the pipe 5 air-tightly passes through the insulating seal member 4 and is joined to the gas introduction hole 3*b*. The pipe 5 may be water-cooled outside of the evaporation source 1.

As the process gas G which is supplied from the gas supply means to the gas introduction hole 3*b* through the pipe 5, for example, gas such as $N_2$ (nitrogen), Ar (argon), or hydrocarbon can be used. In addition, when the material of the evaporation source 1 is, for example, Ti or a Ti alloy, it is preferable that the process gas G contains $C_2H_2$ (acetylene). Since the material of the evaporation source 1 of the film forming device 100 according to the embodiment is Ti, the process gas G contains $C_2H_2$.

For example, the gas passage 3*a* may have a continuous annular groove shape over the entire circumference of the auxiliary electrode 3. Alternatively, plural gas passages 3*a* may be disposed to be parallel to the central axis C of the auxiliary electrode 3 at a predetermined interval over the entire circumference of the auxiliary electrode 3. For example, in the former gas passage 3*a*, the gas discharge hole 3*c* may be a continuous annular opening over the entire circumference of the auxiliary electrode 3. Alternatively, in the latter gas passages 3, the gas discharge holes 3*c* may be plural openings which are disposed over the entire circumference of the auxiliary electrode 3 at a predetermined interval.

For example, the auxiliary electrode 3 is provided to extend downward from the upper closing member 2A along the central axis of the cylindrical evaporation source 1. As a result, the auxiliary electrode 3 has the gas discharge hole 3*c* of the gas passage 3*a* near an arc spot AS of the evaporation source 1 such that the process gas G is supplied to a region near the arc spot AS of the evaporation source 1, that is, to the arc spot AS and a peripheral region thereof.

In the film forming device 100 according to the embodiment, a shield member 6 is disposed between the evaporation source 1 and the auxiliary electrode 3 so as to prevent discharge therebetween. The shield member 6 is formed of, for example, a metal material such as stainless steel. In the embodiment, the shield member 6 is formed in a cylindrical shape as in the case of the evaporation source 1 and the auxiliary electrode 3 and has a diameter which is less than the inner diameter of the evaporation source 1 and is more than the outer diameter of the auxiliary electrode 3.

The shield member 6 is electrically insulated from the evaporation source 1 and the auxiliary electrode 3. Specifically, for example, the shield member 6 is fixed to and held at the insulating seal member 4 between the evaporation source 1 and the closing member 2A. That is, the shield member 6 is disposed between the evaporation source 1 and the auxiliary electrode 3 through the insulating member. When it is estimated that the risk of discharge between the evaporation source 1 and the auxiliary electrode 3 is low, the shield member 6 is not necessarily provided.

Hereinafter, the effects of the film forming device 100 according to the embodiment will be described.

In order to form a film on the surface of the workpiece W using the film forming device 100, first, the workpiece W is accommodated in the internal space 1A of the evaporation source 1, and the internal space 1A of the evaporation source 1 is closed by the upper and lower closing members 2A, 2B through the insulating seal member 4. As a result, for example, the auxiliary electrode 3 which is fixed to the lower surface of the upper closing member 2A is disposed along the inner wall surface 1a of the evaporation source 1. In addition, the shield member 6 which is fixed to the insulating seal member 4 is disposed between the evaporation source 1 and the auxiliary electrode 3. In addition, the workpiece W is held by an appropriate holding structure (not shown) and is connected to the bias supply BS in a state of being electrically insulated from the upper and lower closing members 2A, 2B and the evaporation source 1.

Next, in a state where the internal space 1A of the evaporation source 1 is caused to be in a high-vacuum state using the vacuum device, the process gas G is supplied from the gas supply means to the internal space 1A of the evaporation source 1 through the gas passage 3a of the auxiliary electrode 3. Using the bias supply BS, a bias voltage of, for example, −300 V to −500 V is applied to the workpiece W. Using the external power supply ES, a voltage of, for example, about 30 V is applied to the evaporation source 1, and a discharge current of about 55 A is supplied to the evaporation source 1. In addition, the closing members 2A, 2B and the auxiliary electrode 3 are grounded.

As a result, arc discharge occurs such that a high-density current is concentrated on the arc spot AS of the inner wall surface 1a of the evaporation source 1, and the ions i of the metal material of the evaporation source 1 are discharged and deposited on the surface of the workpiece W to form a film thereon. When the ions i are discharged from the evaporation source 1 by arc discharge, the electrons e are simultaneously emitted.

Figure 6:
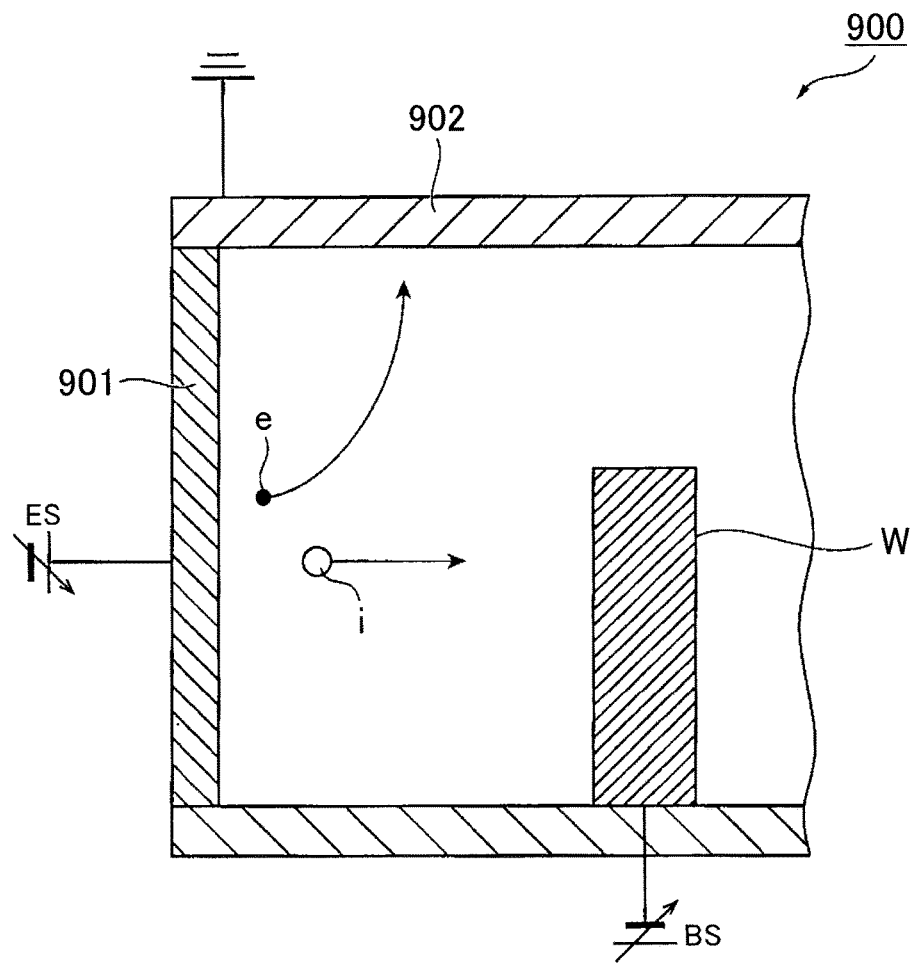
FIG. 6 is an enlarged cross-sectional view showing a film forming device of the related art.

FIG. 6 is an enlarged cross-sectional view showing a film forming device 900 of the related art corresponding to the enlarged cross-sectional view of the film forming device 100 according to the embodiment which is shown in FIG. 2.

In the film forming device 900 of the related art, the electrons e which are emitted from the evaporation source 901 by arc discharge intensively flow to the closing members 902 to generate a current such that the closing members 902 are Joule-heated. As a result, the closing members 902 are heated to a high temperature due to a long period of discharge, and a seal member, such as an O-ring or a gasket (Teflon sheet), which maintains a vacuum between the closing members 902 and the evaporation source 901 may be damaged by heat. In addition, the grounded anode is formed of only the closing members 902. Therefore, the area of the anode is insufficient, and a long period of discharge may be unstable.

On the other hand, in the film forming device 100 according to the embodiment, the auxiliary electrode 3 that allows the electrons e to flow from the internal space 1A of the evaporation source 1 is disposed along the inner wall surface 1a of the evaporation source 1. That is, the auxiliary electrode 3 is grounded so as to function as the anode as in the case of the closing members 2A, 2B. In addition, if the auxiliary electrode 3 is not provided, the closing members 2A, 2B receive a portion of the flowing electrons e. As a result, as compared to the related art, the amount of electrons e flowing to the closing members 2A, 2B decreases, the amount of a current generated in the closing members 2A, 2B decreases, and the amount of Joule heat generated in the closing members 2A, 2B can be suppressed.

Instead of being grounded, the auxiliary electrode 3 may be applied with a positive voltage which is lower than a voltage applied to the evaporation source 1. In this case, the electrons e is concentrated on the auxiliary electrode 3 such that a more amount of the electrons e can flow from the internal space 1A of the evaporation source 1 to the auxiliary electrode 3.

That is, in the film forming device 100 according to the embodiment, the evaporation source 1 forms the cathode, and the closing members 2A, 2B and the auxiliary electrode 3 forms the anode. As a result, the area of the anode is increased to be larger than that of the related art due to the auxiliary electrode 3, and arc discharge in the internal space 1A of the evaporation source 1 can be made to be stable. That is, the auxiliary electrode 3 is provided at a position near the arc spot AS as an anode which is grounded or has a positive potential. As a result, the electrons e smoothly flow, and arc discharge is stable.

In addition, the auxiliary electrode 3 includes a gas passage 3a which supplies process gas G to the internal space 1A of the evaporation source 1. As a result, the gas passage is disposed along the inner wall surface 1a of the evaporation source 1 such that the electrons e are likely to flow thereto, and the auxiliary electrode 3 and peripheral members thereof which are likely to be heated to a relatively high temperature are actively cooled by the process gas G, which can suppress a temperature increase. As a result, the auxiliary electrode 3 as the anode is air-cooled, the damage and thermal deformation of the insulating seal member 4 disposed around the auxiliary electrode 3 can be prevented, and the damage and thermal deformation of the auxiliary electrode 3 as the anode and the closing member 2A, 2B can be prevented. That is, the gas passage 3a for the supply of the process gas G functions as the internal cooling structure of the closing members 2A, 2B and the auxiliary electrode 3.

Originally, in the internal space 1A of the evaporation source 1 in a high-vacuum state, thermal conduction through the convection of the process gas G does not occur. However, by causing the process gas G to flow through the inside of the auxiliary electrode 3 as the anode, the process gas G is circulated by convection to cause thermal conduction in the auxiliary electrode 3, which can suppress a temperature increase of the auxiliary electrode 3. Accordingly, the thermal deformation and damage of the auxiliary electrode 3 and the peripheral members thereof such as the insulating seal member 4 can be efficiently suppressed. In addition, the heat resistance temperature of the insulating seal member 4 such as an O-ring or a gasket can be decreased.

Further, the pipe 5 which supplies the process gas G to the gas passage 3a is cooled in an external space of the evaporation source 1. As a result, the pipe 5 can be cooled, and the auxiliary electrode 3 can be cooled through the pipe 5. In addition, the process gas G flowing through the inside of the pipe 5 is cooled, and the cooling effect of the auxiliary electrode 3 can be improved due to the process gas G.

The auxiliary electrode 3 has the gas discharge hole 3c of the gas passage 3a near the arc spot AS of the evaporation source 1 such that the process gas G is supplied to the arc spot AS of the evaporation source 1. As a result, in the internal space 1A of the evaporation source 1 in a high-vacuum state, plasma can be efficiently generated in the region near the arc spot AS to make arc discharge stable.

Due to arc discharge, not only the ions i and the electrons e of the metal material of the evaporation source 1 but also droplets which are metal particles are discharged to the internal space 1a of the evaporation source 1, in which the metal particles are obtained by melting the metal material of the inner wall surface 1a of the evaporation source 1 and scattering the molten metal material to be solidified. When these droplets are incorporated into the film on the surface of the workpiece W, the surface roughness of the film may deteriorate.

FIG. 3A is a schematic diagram showing droplets d produced from TiC on the inner wall surface 1a of the evaporation source 1. FIG. 3B is a schematic diagram showing droplets D produced from Ti on the inner wall surface 1a of the evaporation source 1.

In the film forming device 100 according to the embodiment, by using Ti as the material of the evaporation source 1, the process gas G containing $C_2H_2$ is supplied from the gas passage 3a of the auxiliary electrode 3. $C_2H_2$ is decomposed by plasma, and a reaction of $C_2H_2 \rightarrow 2C+H_2$ occurs. Therefore, on the inner wall surface 1a of the evaporation source 1, a reaction of Ti+C→TiC occurs, and TiC having a higher melting point than that of Ti is likely to be produced on the inner wall surface 1a of the evaporation source 1. When TiC is produced on the inner wall surface 1a of the evaporation source 1, the amount and range of the metal material which is melted by arc discharge decreases, and molten pool decreases as compared to Ti. Accordingly, when TiC is produced on the inner wall surface 1a of the evaporation source 1, the particle size of the droplets d containing non-melted particles can be made to be less than that of the droplets D produced from Ti.

In this way, by reducing the particle size of the droplets d, the surface roughness of the film of the workpiece W can be reduced. For example, when an arithmetic mean roughness Ra of a film not containing $C_2H_2$ is about 0.1, by supplying $C_2H_2$ thereto, the arithmetic mean roughness Ra is decreased to about 0.06, and the surface roughness of the film can be reduced by about 40%. In addition, the contamination of the evaporation source 1 and the closing members 2A, 2B caused by the droplets is suppressed, the attached droplets can be easily removed, and the frequency of the removal can be decreased.

The auxiliary electrode 3 as the anode is disposed along the inner wall surface 1a of the evaporation source 1 as the cathode. For example, a potential difference of about 30 V is generated between the anode and the cathode. Typically, glow discharge does not occur between the auxiliary electrode 3 and the evaporation source 1. However, due to some abnormal situations, glow discharge may occur. When direct discharge occurs in this way, the ions i of the metal material constituting the evaporation source 1 may be inefficiently deposited on the surface of the workpiece W.

However, in the film forming device 100 according to the embodiment, the shield member 6 is disposed between the evaporation source 1 and the auxiliary electrode 3 so as to prevent discharge therebetween. As a result, by the shield member 6 preventing discharge between the evaporation source 1 and the auxiliary electrode 3, the ions i of the metal material constituting the evaporation source 1 can be efficiently deposited on the surface of the workpiece W.

Here, the shield member 6 is fixed to the auxiliary electrode 3 and the evaporation source 1 through the insulating seal member 4 having electrical insulating properties and is not grounded. As a result, the shield member 6 is electrically insulated from the evaporation source 1 and the auxiliary electrode 3 such that the potential can be made to be the same as that of plasma of the internal space 1A of the evaporation source 1, and discharge between the evaporation source 1 and the auxiliary electrode 3 can be efficiently prevented.

Hereinabove, the film forming device according to the invention has been described in detail based on the embodiment with reference to the drawings. However, a specific configuration is not limited to the embodiment, and design changes and the like which are made within a range not departing from the scope of the invention are included in the invention.

Figure 4:
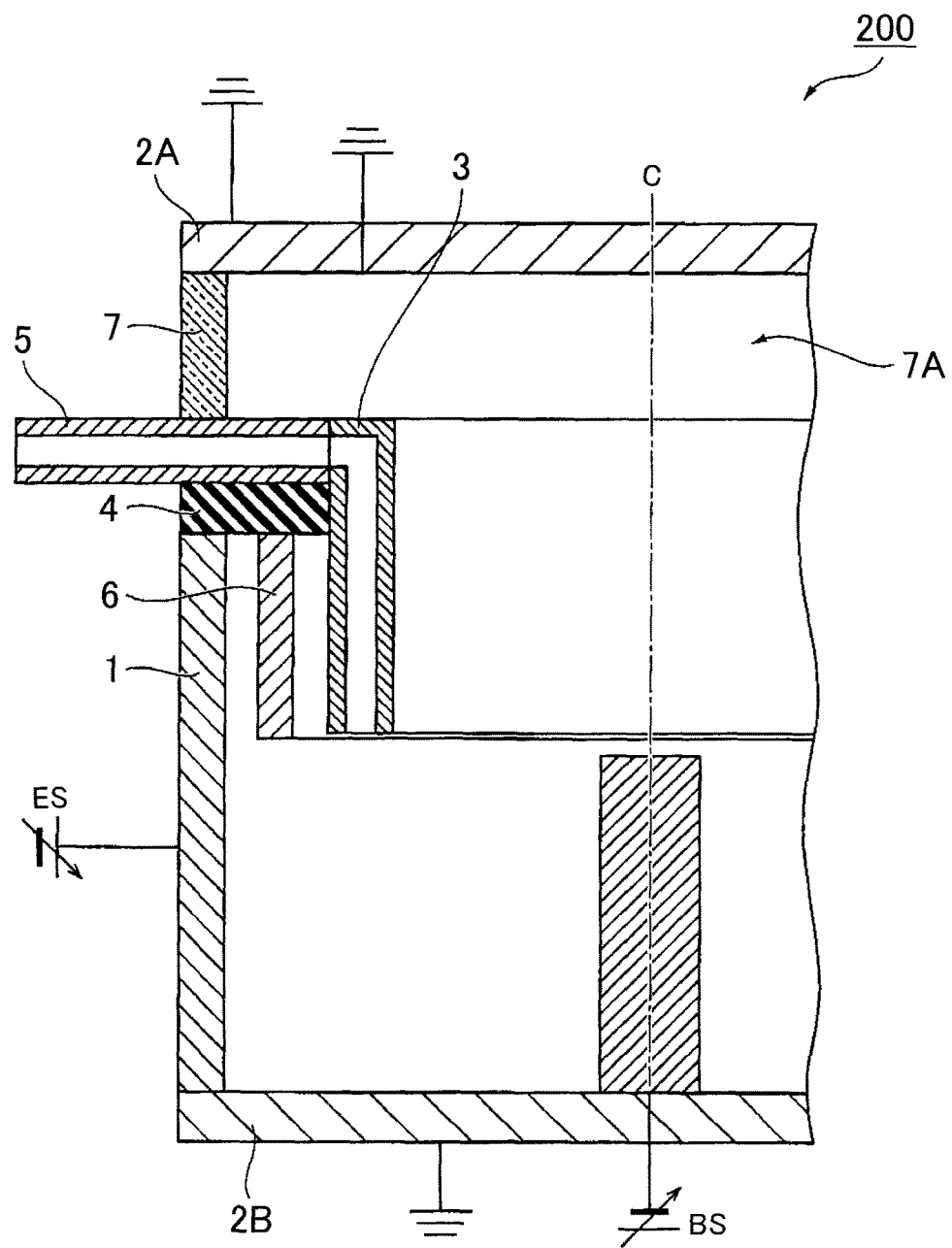
FIG. 4 is an enlarged cross-sectional view showing a modification example of the film forming device shown in FIG. 2.

FIG. 4 is an enlarged cross-sectional view corresponding to FIG. 2 showing a modification example of the film forming device 100 according to the above-described embodiment.

A film forming device 200 according to the modification example is different from the film forming device 100 according to the above-described embodiment, in that an observation window 7 is provided between the upper closing member 2A and the insulating seal member 4. The other configurations of the film forming device 200 according to the modification example are the same as those of the film forming device 100 according to the above-described embodiment. Therefore, the same components are represented by the same reference numerals, and the description thereof will not be repeated. For example, the observation window 7 formed of a heat-resistant and translucent material is provided at a part of a cylindrical main portion 7A formed of a metal material. For example, the cylindrical main portion 7A and the observation window 7 are fixed to the upper closing member 2A. By providing the observation window 7 in this way, the film formation state on the surface of the workpiece W can be checked, and the contamination state of the surfaces of the evaporation source 1 and the closing member 2A, 2B can be checked.

In addition, in the above description of the film forming device 100 according to the above-described embodiment, the cylindrical auxiliary electrode 3 includes the gas passage 3a. However, the configuration of the auxiliary electrode 3 is not limited to the configuration of the above-described embodiment. That is, the auxiliary electrode 3 may not have the gas passage 3a. In this case, a nozzle and the like which supply the process gas G to the internal space 1A of the evaporation source 1 can be separately provided.

In addition, when the auxiliary electrode 3 does not include the gas passage 3a, in order to improve heat resistance, for example, a high melting point metal other than Mo (molybdenum) such as W (tungsten), Ta (tantalum), or Nb (niobe); a heat-resistant alloy thereof such as HASTELLOY (trade name), INCONEL (trade name), or NiCrAlY; and a conductive ceramic such as WC (tungsten carbide), TiN, cermet, or graphite can be used as the material of the auxiliary electrode 3. In addition, as the auxiliary electrode 3, an electrode material such as Al having a surface plated with a highly conductive metal such as Au, Ag, or Cu may be used.

FIGS. 5A to 5D are perspective views showing modification examples of the auxiliary electrode 3 included in the film forming device 100 according to the above-described embodiment.

Figure 5A:
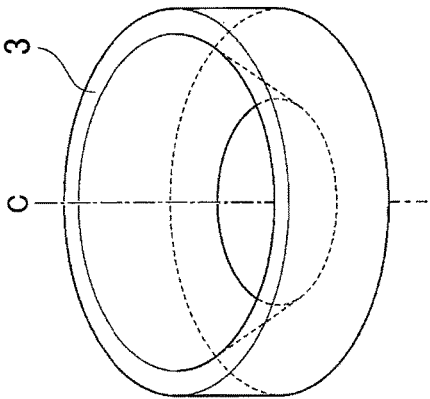
FIG. 5A is a schematic perspective view showing a modification example of an auxiliary electrode.

As shown in FIG. 5A, plural grooves 3d may be formed on the outer circumference of the auxiliary electrode 3. As a result, the strain amount during thermal deformation can be reduced, and heat dissipation can be improved. The same effect can be obtained by providing plural slits instead of the grooves 3d.

Figure 5B:
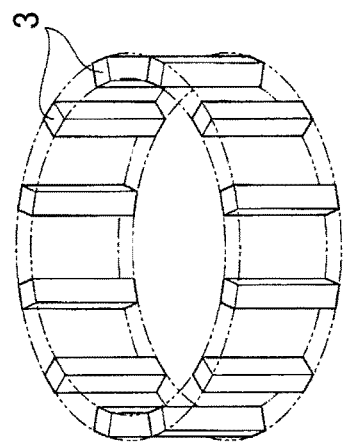
FIG. 5B is a schematic perspective view showing a modification example of the auxiliary electrode.

As shown in FIG. 5B, the thickness of the auxiliary electrode 3 may be changed in the thickness direction, that is, along the central axis C. In this case, by increasing the thickness toward an end which comes into contact with plasma, that is, an end near the arc spot AS, the thermal deformation of the auxiliary electrode 3 can be suppressed.

Figure 5C:
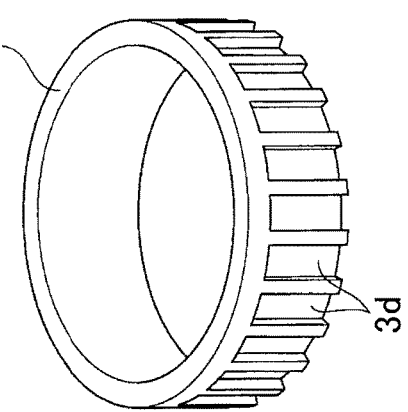
FIG. 5C is a schematic perspective view showing a modification example of the auxiliary electrode.
Figure 5D:
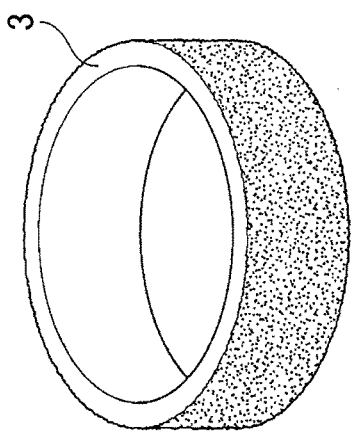
FIG. 5D is a schematic perspective view showing a modification example of an auxiliary electrode.

As shown in FIG. 5C, convex and concave portions may be formed on the surface of the auxiliary electrode 3 using, for example, shot blasting. As a result, the heat dissipation of the auxiliary electrode 3 can be improved. In addition, as shown in FIG. 5D, instead of a cylindrical shape, the auxiliary electrode 3 may have a shape in which plural rod-shaped, columnar, or needle-shaped portions are disposed around a circle. As a result, the heat dissipation of the auxiliary electrode 3 can be improved, and the amount of a material used can be suppressed.

In the description of the above-described embodiment, the upper and lower openings of the cylindrical evaporation source 1 are closed by the closing members 2A, 2B, and the auxiliary electrode 3 is disposed adjacent to the upper closing member 2A. However, the auxiliary electrode 3 may be inverted and fixed to the lower closing member 2B. In addition, the auxiliary electrode 3 may be provided at both the upper closing member 2A and the lower closing member 2B. That is, the auxiliary electrode 3 can be disposed at any of the upper and lower closing members 2A, 2B.

What is claimed is:

1. A film forming device comprising:
a cylindrical evaporation source configured to accommodate a workpiece in an internal space of the cylindrical evaporation source, the cylindrical evaporation source configured to discharge ions from the evaporation source by arc discharge such that the ions are deposited on a surface of the workpiece;
closing members configured to close the internal space; and
an auxiliary electrode disposed along an inner wall surface of the cylindrical evaporation source, the auxiliary electrode configured to be grounded or to be applied with a positive voltage such that electrons of the internal space flow to the auxiliary electrode,
wherein the cylindrical evaporation source is a cathode, and the closing members and the auxiliary electrode are anodes, and
wherein the closing members and the auxiliary electrode each have an internal cooling structure.

2. The film forming device according to claim 1, wherein the auxiliary electrode includes a gas passage which supplies process gas to the internal space.

3. The film forming device according to claim 2, wherein the auxiliary electrode has a gas discharge hole of the gas passage near an arc spot of the cylindrical evaporation source such that the process gas is supplied to a region near the arc spot.

4. The film forming device according to claim 3, wherein a material of the cylindrical evaporation source is titanium or a titanium alloy, and
the gas passage is configured to supply gas containing acetylene as the process gas.

5. The film forming device according to claim 1, further comprising:
a shield member that is disposed between the cylindrical evaporation source and the auxiliary electrode such that discharge between the cylindrical evaporation source and the auxiliary electrode is prevented.

6. The film forming device according to claim 5, wherein the shield member is insulated from the cylindrical evaporation source and the auxiliary electrode.

* * * * *